(12) United States Patent
Fang et al.

(10) Patent No.: US 10,454,031 B2
(45) Date of Patent: Oct. 22, 2019

(54) PIXEL STRUCTURE BASED ON INKJET PRINTING TECHNOLOGY AND METHOD FOR MANUFACTURING THE SAME

(71) Applicant: Shenzhen China Star Optoelectronics Technology Co., Ltd., Shenzhen, Guangdong (CN)

(72) Inventors: Chun Hsiang Fang, Guangdong (CN); Yuan Chun Wu, Guangdong (CN); Po Yen Lu, Guangdong (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 15/562,693

(22) PCT Filed: Jul. 11, 2017

(86) PCT No.: PCT/CN2017/092448
§ 371 (c)(1),
(2) Date: Sep. 28, 2017

(87) PCT Pub. No.: WO2018/232793
PCT Pub. Date: Dec. 27, 2018

(65) Prior Publication Data
US 2019/0273206 A1 Sep. 5, 2019

(30) Foreign Application Priority Data

Jun. 19, 2017 (CN) .......................... 2017 1 0464655

(51) Int. Cl.
*H01L 51/50* (2006.01)
*H01L 51/00* (2006.01)
(Continued)

(52) U.S. Cl.
CPC ...... *H01L 51/0005* (2013.01); *H01L 27/3246* (2013.01); *H01L 51/0023* (2013.01); *H01L 51/5012* (2013.01); *H01L 51/5056* (2013.01); *H01L 51/5072* (2013.01); *H01L 51/5088* (2013.01); *H01L 51/5092* (2013.01);
(Continued)

(58) Field of Classification Search
None
See application file for complete search history.

(56) References Cited

U.S. PATENT DOCUMENTS 10,153,333 B1 * 12/2018 Li .................... H01L 27/3246
2012/0049175 A1 * 3/2012 Ono ................. H01L 27/3246
257/40

(Continued)

*Primary Examiner* — Angel Roman

(57) ABSTRACT

Disclosed are a pixel structure based on ink-jet printing technology and a method for manufacturing the same. In the pixel structure and in the method for manufacturing the same, a metal oxide semi-conductive material is used for forming an anode layer. The anode layer is divided into conductive areas and semi-conductive areas by conductive treatment. The semi-conductive areas play a same role as a dielectric layer in the prior art. The method for manufacturing the pixel structure is simple because formation of the dielectric layer is not needed. An organic functional layer formed by ink-jet has a uniform film thickness, which effectively improves quality of a product.

20 Claims, 7 Drawing Sheets

(51) Int. Cl.
*H01L 51/52* (2006.01)
*H01L 29/49* (2006.01)
*H01L 27/32* (2006.01)
*H01L 21/00* (2006.01)

(52) U.S. Cl.
CPC ...... *H01L 51/5209* (2013.01); *H01L 51/5221* (2013.01); *H01L 2227/323* (2013.01); *H01L 2251/308* (2013.01)

(56) References Cited

U.S. PATENT DOCUMENTS

2017/0110519 A1* 4/2017 Hsu .................. H01L 51/5265
2019/0173039 A1* 6/2019 Ishikura ............. H01L 51/5088

* cited by examiner

PIXEL STRUCTURE BASED ON INKJET PRINTING TECHNOLOGY AND METHOD FOR MANUFACTURING THE SAME

CROSS-REFERENCE TO RELATED APPLICATIONS

This application claims the priority of Chinese patent application CN 201710464655.8, entitled "Pixel structure based on inkjet printing technology and method for manufacturing the same" and filed on Jun. 19, 2017, the entirety of which is incorporated herein by reference.

FIELD OF THE INVENTION

The present disclosure relates to the field of OLED (organic light-emitting diode) manufacturing, and in particular, to a pixel structure based on inkjet printing technology and a method for manufacturing the same.

BACKGROUND OF THE INVENTION

An organic light-emitting diode (OLED) display device, which is also known as an organic electroluminescent display device, has many advantages. For example, the OLED display device is self-luminous, can be driven at a low voltage. Moreover, the OLED display device has high luminous efficiency, short response time, high definition and contrast, a wide viewing angle, and a wide working temperature range. Besides, flexible display and large-area full-color display can be achieved. Therefore, the OLED display device is regarded as a display device which has greatest development potential in the industry.

In the prior art, an OLED display panel generally comprises an anode, an organic functional layer and a cathode which are formed on a substrate sequentially. The organic functional layer generally comprises a hole injection layer arranged on the anode, a hole transport layer arranged on the hole injection layer, a light-emitting layer arranged on the hole transport layer, an electron transport layer arranged on the light-emitting layer, and an electron injection layer arranged on the electron transport layer. A light-emitting principle of the OLED display panel is that a semi-conductive material and an organic light-emitting material, driven by an electric field, emit light by means of carrier injection and recombination. Specifically, driven by a certain voltage, electrons and holes are injected into the electron injection layer and the hole injection layer from the cathode and the anode respectively, and the electrons and holes are transferred to the light-emitting layer through the electron transport layer and the hole transport layer respectively. The electrons and holes meet in the light-emitting layer and form excitons which excite luminescent molecules, and the luminescent molecules emit visible light after radiative relaxation.

A traditionally used manner for manufacturing metal layer films of the organic functional layer and the cathode in the OLED display panel is vacuum vapor deposition. With the development of technology, ink-jet printing, which has advantages compared with the vacuum vapor deposition, is gradually used by manufacturers.

In a process for manufacturing the OLED display panel, ink-jet printing has advantages, compared with the vacuum vapor deposition, in material utilization rate and cost. FIG. 1 schematically shows a conventionally used pixel design manner in which sub-pixel units of RGB colors are arranged side by side. Since definition of a display panel is improved continuously, more and more pixel units are arranged, while sizes of the pixel units become smaller and smaller. Therefore, an area for ink-jet operation of an ink-jet printer within a pixel unit is relatively small. The precision of an existing ink-jet printer cannot meet requirements for manufacture of the display panel gradually, and requirements for manufacture of a higher-definition display product cannot be met by the ink-jet printer due to its limitations. In order to overcome such a technical problem, a new two-in-one pixel design as shown in 2a is provided, which can effectively increase the area for ink-jet operation of the ink-jet printer. Therefore, requirements for manufacture of a higher-definition display product can be met. FIG. 2b schematically shows a magnified structure of a single sub-pixel structure of FIG. 2a, and FIG. 2c is a sectional view of FIG. 2b in A-A direction. In order to clearly explain technical problems existing in the prior art, FIG. 2b and FIG. 2c only schematically show a substrate, an anode, a dielectric layer, a pixel range defining structure and an organic functional layer. Structures of other parts are not schematically shown, but those skilled in the art can make specific arrangements according to needs. As shown in FIG. 2b and FIG. 2c, two adjacent sub-pixel structures having a same color are arranged together in such a two-in-one pixel process. On a substrate 1, anodes 2 of two adjacent sub-pixel structures having a same color are separated by a dielectric layer 3 arranged therebetween. A pixel range defining structure 4 is arranged on the anodes 2, and is used to define an ink-jet area. In an ink-jet process, functional material ink is instilled into the ink-jet area defined by the pixel range defining structure 4 by means of a plurality of nozzles of an ink-jet printer, and then a desired film 5 is obtained by drying. Technical problems exist in such a process. After anodes 2 are formed on the substrate 1, the anode need to be etched so as to form the dielectric layer 3. Therefore, the process is complicated. Moreover, since hydrophilicity and hydrophobicity of the dielectric layer 3 to the functional material ink are different from those of the pixel range defining structure 4 to the functional material ink, a non-uniform thickness of a film formed by the functional material ink in the ink-jet area can be caused easily.

SUMMARY OF THE INVENTION

In order to solve technical problems existing in the prior art, the present disclosure provides a method for manufacturing a pixel structure based on ink-jet printing technology. The method comprises following steps.

Step S1: An anode layer is formed on a substrate using a metal oxide semi-conductive material, and the anode layer is patterned.

Step S2: A photoresist layer is formed on the anode layer, and the photoresist layer is patterned. The patterned photoresist layer covers the anode layer partially.

Step S3: Conductive treatment is performed to portions of the anode layer which are not covered by the photoresist layer, and then the photoresist layer is removed.

Step S4: A pixel defining layer is formed on the anode layer, and a plurality of through-holes, which are spaced from one another, are formed on the pixel defining layer. The anode layer at the through-holes is exposed, and an exposed portion of the anode layer is a pixel area defined therein.

Step S5: An organic functional layer is formed by ink-jet printing in pixel areas defined in step S4.

The portions of the anode layer to which conductive treatment is performed are conductive areas, and portions of the anode layer to which the conductive treatment is not performed are semi-conductive areas. A middle part of each pixel area is a semi-conductive area.

As a further improvement on the method, the metal oxide semi-conductive material in step S1 is indium gallium zinc oxide, indium tin zinc oxide, indium gallium tin zinc oxide or indium aluminium oxide.

As a further improvement on the method, the photoresist layer in step S2 is formed by coating photoresist.

As a further improvement on the method, the patterned photoresist layer in step S2 has a structure of parallel strips with gaps thereamong.

As a further improvement on the method, the conductive treatment in step S3 is performed using plasma bombarding or ion implantation.

As a further improvement on the method, the pixel defining layer in step S4 is formed by coating an acrylic material or polyimide resin.

As a further improvement on the method, the organic functional layer in step S5 comprises a hole injection layer, a hole transport layer, and a light-emitting layer sequentially arranged on the anode layer.

As a further improvement on the method, the method further comprises a following step. Step S6: An electron transport layer, an electron injection layer, and a cathode layer are formed sequentially on the light-emitting layer formed in S5.

As a further improvement on the method, the electron transport layer, the electron injection layer, and the cathode layer are formed by vapor deposition.

The present disclosure further provides a pixel structure based on ink-jet printing technology, and the pixel structure is manufactured by the above method.

In the method for manufacturing the pixel structure based on ink-jet printing technology according to the present disclosure, the metal oxide semi-conductive material is used for forming the anode layer, and the anode layer is divided into conductive areas and semi-conductive areas by conductive treatment. The semi-conductive areas play a same role as the dielectric layer in the prior art. The method for manufacturing the pixel structure is simple because formation of the dielectric layer is not needed. Besides, an organic functional layer formed by ink jet has a uniform film thickness, which effectively improves quality of a product.

BRIEF DESCRIPTION OF THE DRAWINGS

The present disclosure will be described in a more detailed way below based on embodiments and with reference to the accompanying drawings. In the drawings:

FIG. 2b schematically shows a magnified structure of a single sub-pixel structure of FIG. 2a;

In the accompanying drawings, same components are referred to by same reference signs. The accompanying drawings are not drawn according to actual proportions.

DETAILED DESCRIPTION OF THE EMBODIMENTS

The present disclosure will be illustrated hereinafter with reference to the drawings.

Figure 3:
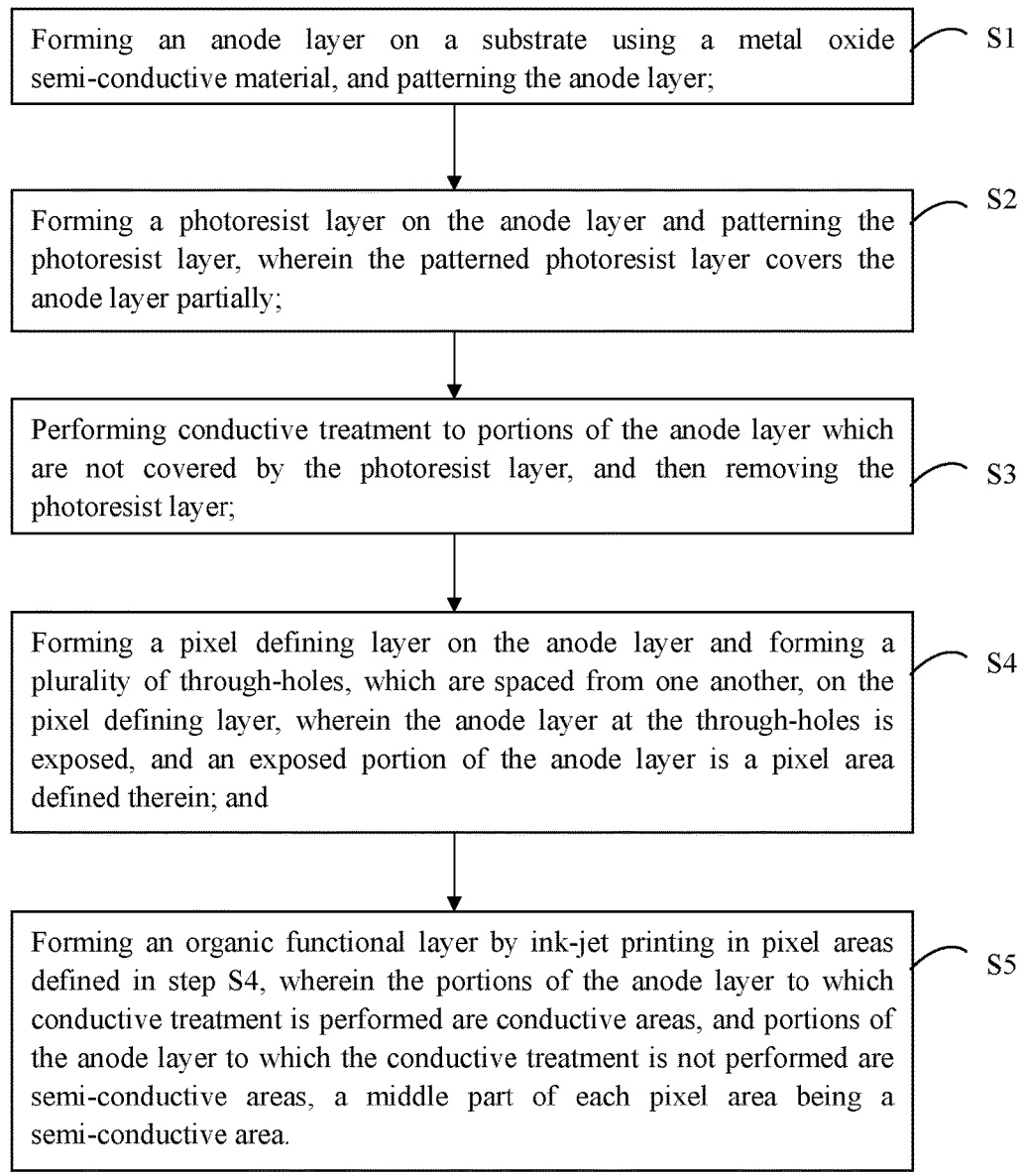
FIG. 3 is a flow chart of a method for manufacturing a pixel structure based on ink-jet printing technology in an embodiment of the present disclosure.

FIG. 3 is a flow chart of a method for manufacturing a pixel structure based on ink-jet printing technology in the present embodiment. It can be seen from FIG. 3 that, the method comprises following steps.

In step S1: an anode layer is formed on a substrate using a metal oxide semi-conductive material, and the anode layer is patterned.

In step S2: a photoresist layer is formed on the anode layer, and the photoresist layer is patterned. The patterned photoresist layer covers the anode layer partially.

In step S3: conductive treatment is performed to portions of the anode layer which are not covered by the photoresist layer, and then the photoresist layer is removed.

In step S4: a pixel defining layer is formed on the anode layer, and a plurality of through-holes, which are spaced from one another, are formed on the pixel defining layer. The anode layer at the through-holes is exposed, and an exposed portion of the anode layer is a pixel area defined therein.

In step S5: an organic functional layer is formed by ink-jet printing in pixel areas defined in step S4.

The portions of the anode layer to which conductive treatment is performed are conductive areas, and portions of the anode layer to which the conductive treatment is not performed are semi-conductive areas. A middle part of each pixel area is a semi-conductive area.

A detailed explanation of respective steps is provided below with reference to FIGS. 4 to 9.

Figure 4:
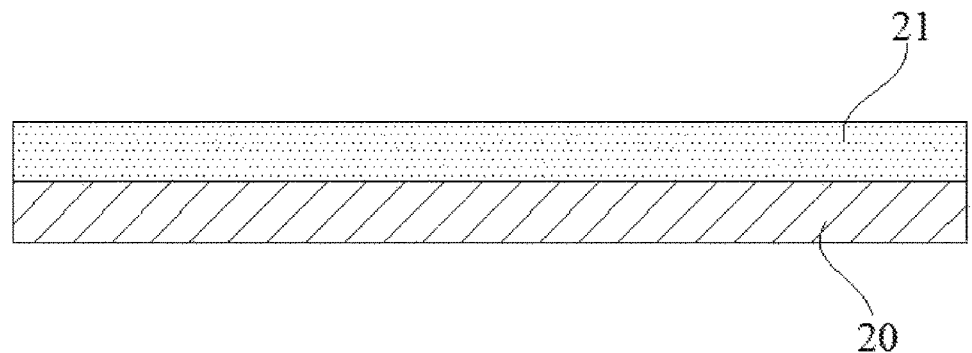
FIG. 4 schematically shows a structure formed in step S1 in the embodiment of the present disclosure.

FIG. 4 schematically shows a structure formed in step S1. As shown in FIG. 4, a substrate 20 is provided, and an anode layer 21 is formed on the substrate 20. Then, the anode layer is patterned, and a structure as shown in FIG. 4 is obtained. The anode layer in the present embodiment is made of a metal oxide semi-conductive material. Preferably, the metal oxide semi-conductive material can be indium gallium zinc oxide (IGZO), indium tin zinc oxide (ITZO), indium gallium tin zinc oxide (IGTZO) or indium aluminium oxide (IAO).

Figure 5:
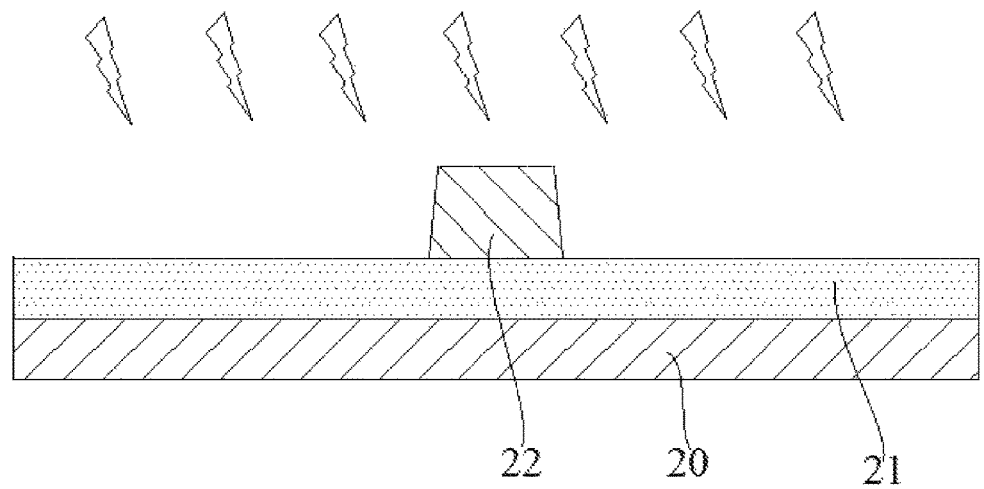
FIG. 5 and FIG. 6 schematically show a structure formed in step S2 and a structure formed in step S3 in the embodiment of the present disclosure.
Figure 6:
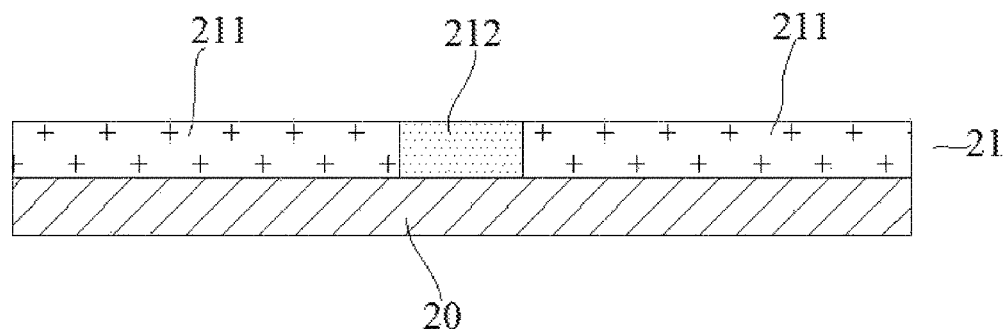

FIG. 5 and FIG. 6 schematically show a structure formed in step S2 and a structure formed in step S3 in the present embodiment. A photoresist layer is formed on the anode layer, and the photoresist layer is patterned so as to form a patterned photoresist layer 22. The patterned photoresist layer 22 covers the anode layer 21 partially. Conductive treatment is performed to portions of the anode layer which are not covered by the patterned photoresist layer. FIG. 5 schematically shows a conductive treatment process with arrows, and the conductive treatment process can be performed using plasma bombarding or ion implantation. After the conductive treatment is finished, the photoresist layer 22 is removed, and a structure as shown in FIG. 6 is obtained. In the structure of FIG. 6, the portions of the anode layer to which conductive treatment is performed are conductive areas 211, and portions of the anode layer to which the conductive treatment is not performed are semi-conductive areas 212.

In some specific embodiments, the photoresist layer 22 can be formed by coating photoresist. Other manners and materials can also be used to form the photoresist layer in the present embodiment as long as the conductive treatment has no effect on portions of the anode layer which are covered by the photoresist layer 22.

Figure 7:
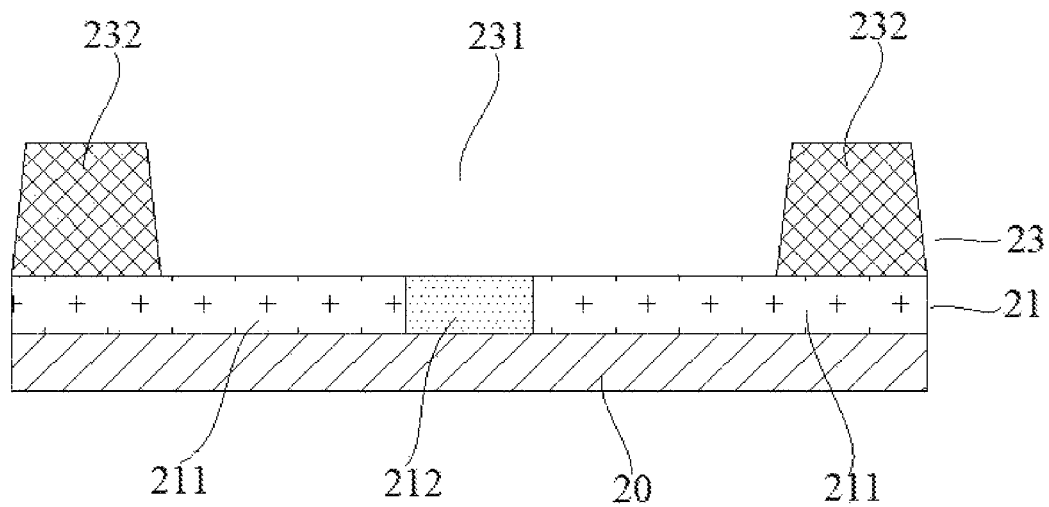
FIG. 7 schematically shows a structure formed in step S4 in the embodiment of the present disclosure.

FIG. 7 schematically shows a structure formed in step S4 in the present embodiment. As shown in FIG. 7, a pixel defining layer 23 is formed on the anode layer 21. A plurality of through-holes 231, which are spaced from one another, are formed on the pixel defining layer. The anode layer 21 at the through-holes 231 is exposed, and exposed portions of the anode layer 21 are pixel areas. The pixel defining layer, apart from the through-holes 231, forms banks 232. The banks 232 surround the through-holes 231, and thus pixel areas are formed on through-hole structures. In the pixel areas, an organic functional layer is formed by ink-jet printing. In some embodiments, the pixel defining layer 23 can be formed by coating an acrylic material or polyimide resin (PI). The acrylic material has a structural formula of

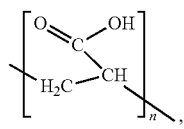

and the polyimide resin has a structural formula of

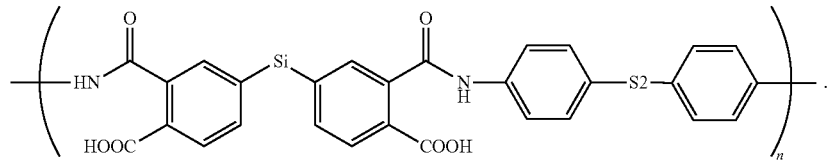

The specific structural formulas of materials of the pixel defining layer shown above are only provided as examples, and do not constitute specific limitations to the protection scope of the present disclosure. Those skilled in the art should know that, a material can be used in the present disclosure as long as it can serve as a pixel defining layer. Requirements for a material of the pixel defining layer in the present disclosure are as follows. The material can be patterned by a photolithography process, and has a lower hydrophilicity after high-temperature solidification is performed to the material. Besides, a surface of a film layer is hydrophobic to ink-jet ink, thereby effectively confining the ink within the pixel defining area. The ink is a functional material ink.

Film formation and patterning processes of the anode layer 21 in step S1, the photoresist layer 22 in step S2, and the pixel defining layer in S4 can be implemented by common technical means in the art. For example, a photo engraving process (PEP), which is also called photolithography generally, can be used to form a film and pattern the film. Those skilled in the art can make specific selections according to actual needs, and details thereof will not be repeated here.

Figure 8:
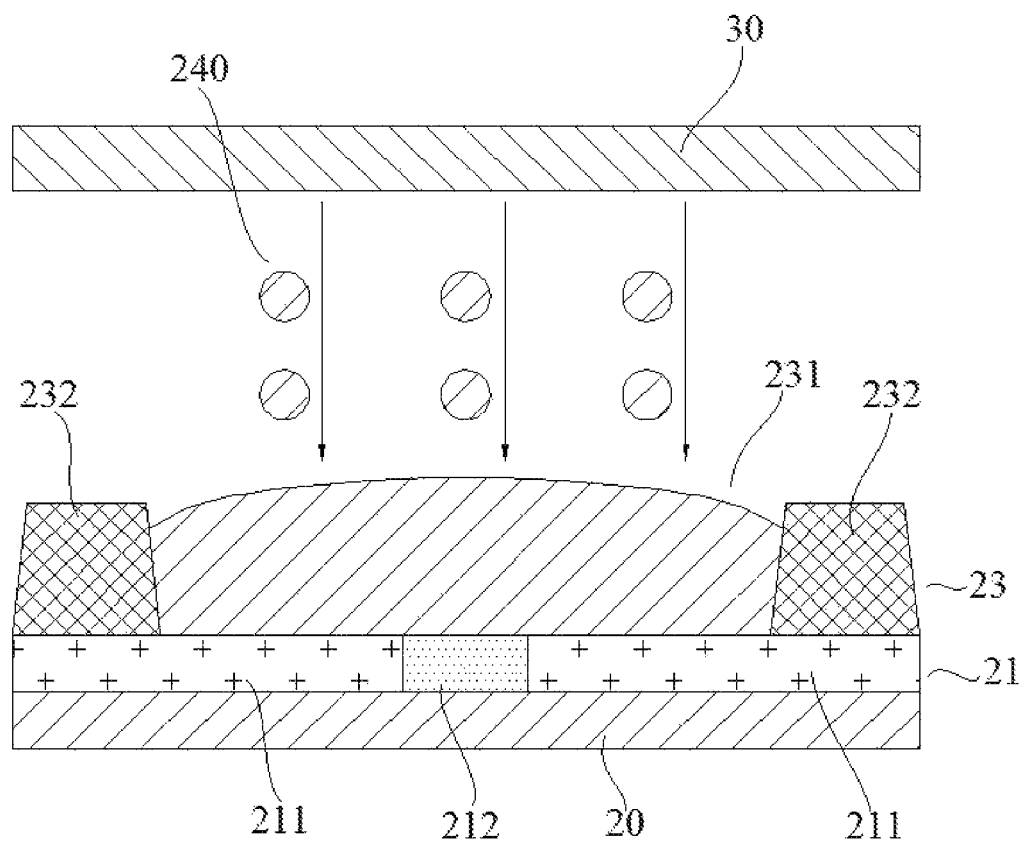
FIG. 8 and FIG. 9 schematically show structures formed in step S5 in the embodiment of the present disclosure.
Figure 9:
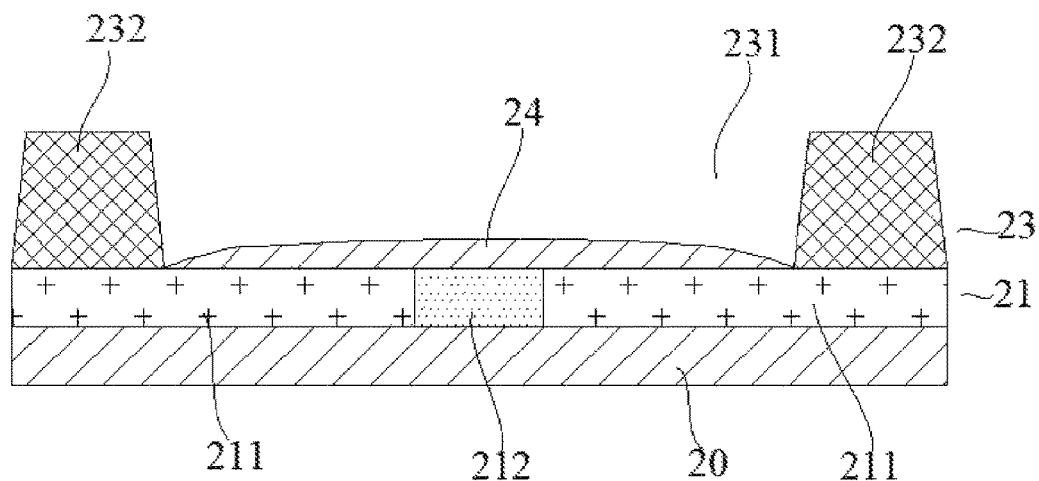

FIG. 8 and FIG. 9 schematically show structures formed in step S5 in the present embodiment. An organic functional layer is formed by ink-jet printing in the pixel area defined in step S4. Specifically, in the present embodiment, an ink-jet printer 30 jets functional material ink 240 into the pixel area, and FIG. 8 schematically shows an ink-jet process. After the ink-jet process is finished, a structure as shown in FIG. 9 is obtained by drying. In the structure as shown in FIG. 9, an organic functional layer 24 is formed within a pixel area defined by the pixel defining layer 23.

In some embodiments, the organic functional layer can comprise multiple layers. For example, the organic functional layer can comprise a hole injection layer (HIL), a hole transport layer (HTL), and a light-emitting layer (EML) sequentially arranged on the anode layer. In actual production, one or two of the hole injection layer, the hole transport layer, and the light-emitting layer can be formed by vapor deposition according to needs.

In some embodiments, the method can further comprise step S6. In step S6, an electron transport layer (ETL), an electron injection layer (EIL), and a cathode layer are formed sequentially on the emitting layer formed in S5. According to actual needs, the electron transport layer, the electron injection layer, and the cathode layer can be formed by vapor deposition which is commonly used in the prior art. If materials for forming respective layers are suitable for ink-jet printing, the ink-jet printing is preferred.

Figure 1:
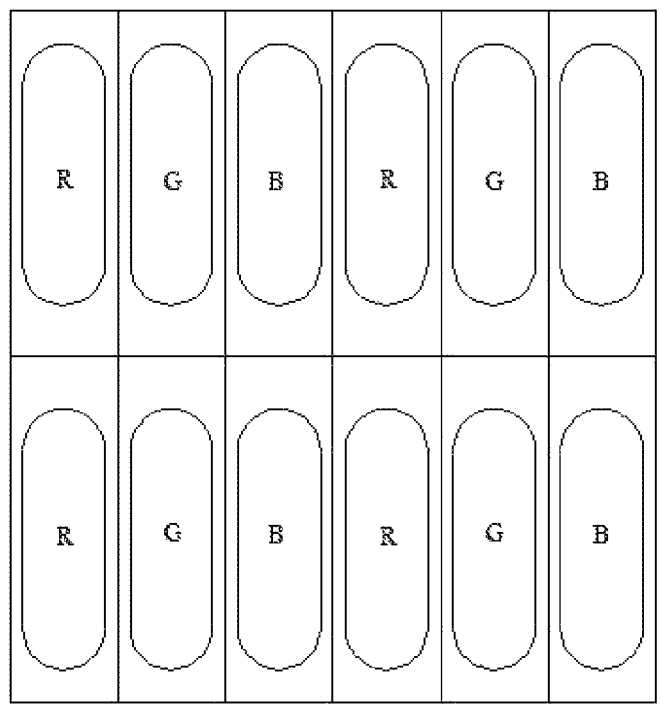
FIG. 1 schematically shows a pixel design manner in which sub-pixel units of RGB colors are arranged side by side in the prior art.
Figure 2A:
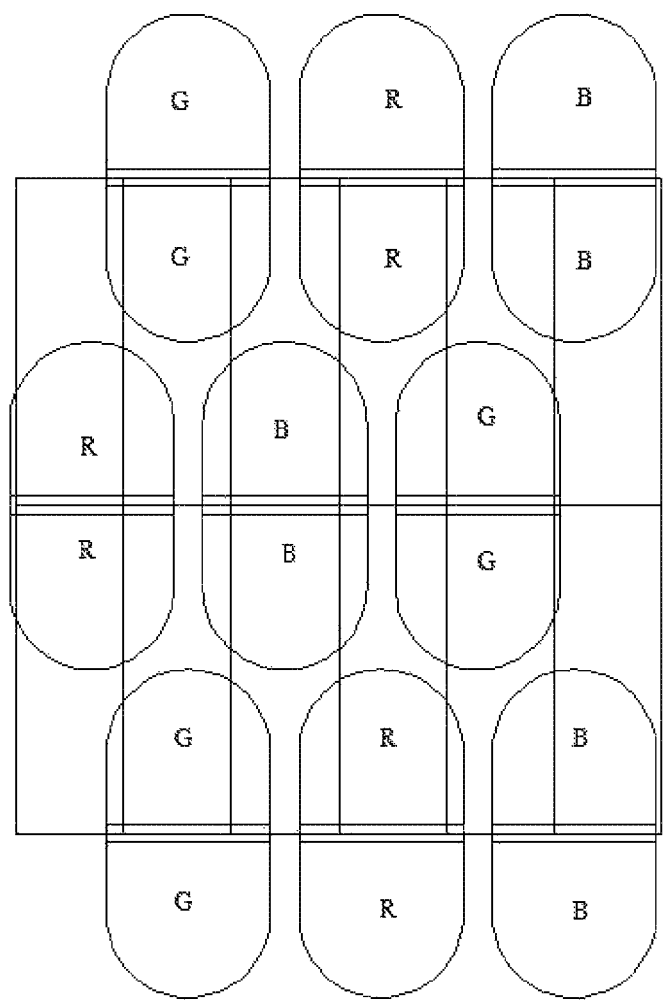
FIG. 2a schematically shows a new two-in-one pixel design manner.
Figure 2B:
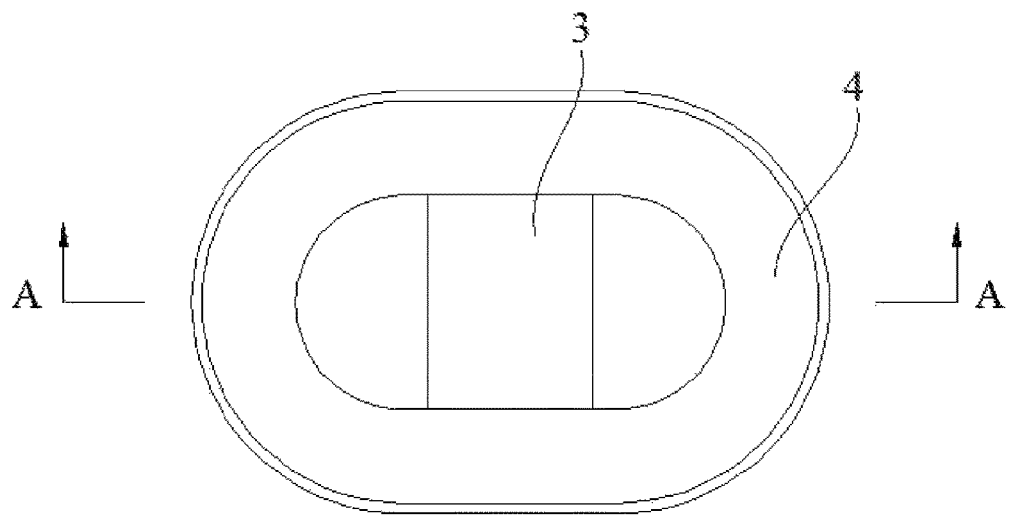
Figure 2C:
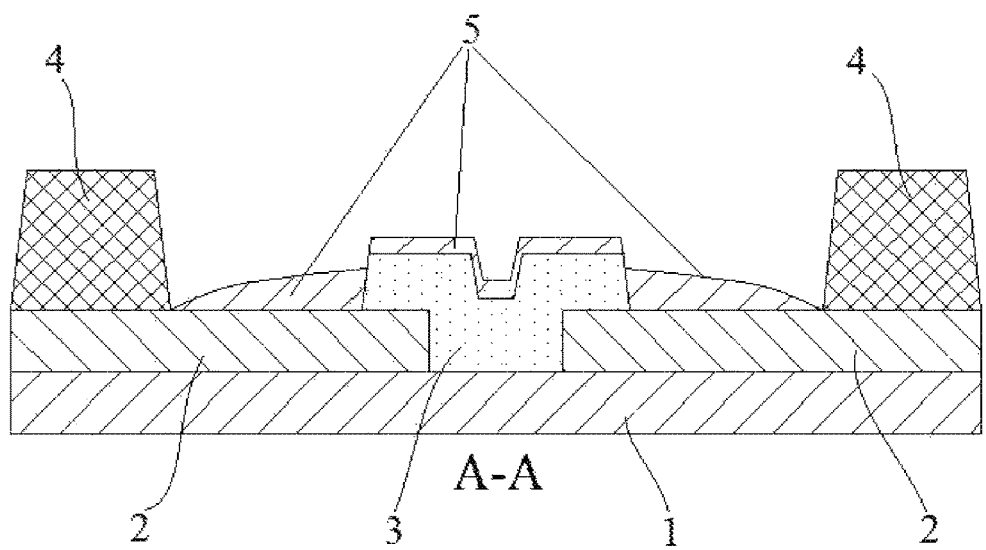
FIG. 2c is a sectional view of FIG. 2b in A-A direction.

FIGS. 4 to 9 in the present disclosure only schematically show a single pixel structure, and those skilled in the art should know that, the method is used for manufacturing all pixel structures on an entire panel actually. A pixel structure arrangement described in the present embodiment is shown in FIG. 2a. One pixel structure unit actually comprises two sub-pixel structure units having a same color. A semi-conductive area 212 of the anode layer is a divisional area of the two sub-pixel structure units. The semi-conductive area separates anode layers of the two sub-pixel structure units from each other, so that the two sub-pixel structure units do not interfere with each other. Therefore, the patterned photoresist layer 22 in step S2 has a structure of parallel strips which are spaced from one another.

Since the semi-conductive area and the conductive areas have same hydrophilicity and hydrophobicity to an organic functional material, the organic functional layer formed on the anode layer 21 has a uniform film thickness. In the pixel structure based on ink-jet printing technology and the method for manufacturing the same disclosed herein, an existing ink-jet printer can be applied so as to meet requirements of a high definition product. Moreover, film thickness uniformity can be improved, thereby enhancing quality of a product.

A pixel structure based on ink-jet printing technology is provided in another embodiment of the present disclosure, and is manufactured by using the method in the above embodiment of the present disclosure. FIG. 9 also can be seen as a pixel structure of the present embodiment. Specifically, as shown in FIG. 9, the pixel structure based on ink-jet printing technology comprises a substrate 20, an anode layer 21, a pixel defining layer 23, and an organic functional layer 24.

The anode layer 21 comprises semi-conductive areas 212 and conductive areas 211. The pixel defining layer 23 comprises a plurality of through-holes 231 are spaced from one another and banks 232 which surround the through-holes. The anode layer at the through-holes 231 is exposed, and an exposed portion of the anode layer is a pixel area defined therein. The semi-conductive areas 212 are located in middle parts of pixel areas. The organic functional layer 24 is formed within the pixel area by ink-jet printing.

In some embodiments, the organic functional layer 24 can comprise multiple layers. For example, the organic functional layer 24 can comprise a hole injection layer (HIL), a hole transport layer (HTL), and a light-emitting layer (EML) sequentially arranged on the anode layer.

In some embodiments, an electron transport layer (ETL), an electron injection layer (EIL), and a cathode layer are formed sequentially on the light-emitting layer.

Although the present disclosure is illustrated in detail in combination with preferred embodiments, it can be understood that, various improvements can be made to the embodiments and components therein can be substituted with equivalents without departing from the protection scope of the present disclosure. In particular, as long as there is no structural conflict, the technical features disclosed in respective embodiments of the present disclosure can be combined with one another in any way. The present disclosure is not limited by the specific embodiments disclosed herein, but includes all technical solutions falling into the protection scope of the claims.

The invention claimed is:

1. A method for manufacturing a pixel structure based on ink-jet printing technology, wherein the method comprises:
    step S1: forming an anode layer on a substrate using a metal oxide semi-conductive material, and patterning the anode layer;
    step S2: forming a photoresist layer on the anode layer and patterning the photoresist layer, wherein the patterned photoresist layer covers the anode layer partially;
    step S3: performing conductive treatment to portions of the anode layer which are not covered by the photoresist layer, and then removing the photoresist layer;
    step S4: forming a pixel defining layer on the anode layer and forming a plurality of through-holes, which are spaced from one another, on the pixel defining layer, wherein the anode layer at the through-holes is exposed, and an exposed portion of the anode layer is a pixel area defined therein; and
    step S5: forming an organic functional layer by ink-jet printing in pixel areas defined in step S4,
    wherein the portions of the anode layer to which conductive treatment is performed are conductive areas, and portions of the anode layer to which the conductive treatment is not performed are semi-conductive areas, a middle part of each pixel area being a semi-conductive area.

2. The method according to claim 1, wherein the organic functional layer in step S5 comprises a hole injection layer, a hole transport layer, and a light-emitting layer sequentially arranged on the anode layer.

3. The method according to claim 2, wherein the method further comprises:
    step S6: forming an electron transport layer, an electron injection layer, and a cathode layer sequentially on the light-emitting layer formed in step S5.

4. The method according to claim 2, wherein the electron transport layer, the electron injection layer, and the cathode layer are formed by vapor deposition.

5. The method according to claim 1, wherein the metal oxide semi-conductive material in step S1 is indium gallium zinc oxide, indium tin zinc oxide, indium gallium tin zinc oxide or indium aluminium oxide.

6. The method according to claim 1, wherein the photoresist layer in step S2 is formed by coating photoresist.

7. The method according to claim 6, wherein the patterned photoresist layer in step S2 has a structure of parallel strips which are spaced from one another.

8. The method according to claim 1, wherein the conductive treatment in step S3 is performed using plasma bombarding or ion implantation.

9. The method according to claim 8, wherein the organic functional layer in step S5 comprises a hole injection layer, a hole transport layer, and a light-emitting layer sequentially arranged on the anode layer.

10. The method according to claim 9, wherein the method further comprises:
    step S6: forming an electron transport layer, an electron injection layer, and a cathode layer sequentially on the light-emitting layer formed in step S5.

11. The method according to claim 9, wherein the electron transport layer, the electron injection layer, and the cathode layer are formed by vapor deposition.

12. The method according to claim 1, wherein the pixel defining layer in step S4 is formed by coating an acrylic material or polyimide resin.

13. The method according to claim 12, wherein the organic functional layer in step S5 comprises a hole injection layer, a hole transport layer, and a light-emitting layer sequentially arranged on the anode layer.

14. The method according to claim 13, wherein the method further comprises:
    step S6: forming an electron transport layer, an electron injection layer, and a cathode layer sequentially on the light-emitting layer formed in step S5.

15. The method according to claim 13, wherein the electron transport layer, the electron injection layer, and the cathode layer are formed by vapor deposition.

16. A pixel structure based on ink-jet printing technology, wherein the pixel structure is manufactured by a method which comprises:
    step S1: forming an anode layer on a substrate using a metal oxide semi-conductive material, and patterning the anode layer;
    step S2: forming a photoresist layer on the anode layer and patterning the photoresist layer, wherein the patterned photoresist layer covers the anode layer partially;
    step S3: performing conductive treatment to portions of the anode layer which are not covered by the photoresist layer, and then removing the photoresist layer;
    step S4: forming a pixel defining layer on the anode layer and forming a plurality of through-holes, which are spaced from one another, on the pixel defining layer, wherein the anode layer at the through-holes is exposed, and an exposed portion of the anode layer is a pixel area defined therein; and
    step S5: forming an organic functional layer by ink-jet printing in pixel areas defined in step S4,
    wherein the portions of the anode layer to which conductive treatment is performed are conductive areas, and portions of the anode layer to which the conductive treatment is not performed are semi-conductive areas, a middle part of each pixel area being a semi-conductive area.

17. The pixel structure according to claim 16, wherein the metal oxide semi-conductive material in step S1 of the method for manufacturing the pixel structure is indium gallium zinc oxide, indium tin zinc oxide, indium gallium tin zinc oxide or indium aluminium oxide.

18. The pixel structure according to claim 16, wherein the conductive treatment in step S3 of the method for manufacturing the pixel structure is performed using plasma bombarding or ion implantation.

19. The pixel structure according to claim 16, wherein the organic functional layer in step S5 of the method for manufacturing the pixel structure comprises a hole injection layer, a hole transport layer, and a light-emitting layer sequentially arranged on the anode layer.

20. The pixel structure according to claim 19, wherein the method for manufacturing the pixel structure further comprises:

step S6: forming an electron transport layer, an electron injection layer, and a cathode layer sequentially on the light-emitting layer formed in step S5.

* * * * *